United States Patent [19]

Krawczak

[11] Patent Number: 5,391,950
[45] Date of Patent: Feb. 21, 1995

[54] CIRCUIT TO ELIMINATE SIGNAL CHATTER IN THE OUTPUT OF A FIBER-OPTIC RECEIVER

[75] Inventor: John A. Krawczak, Minnetonka, Minn.

[73] Assignee: Unisys Corporation, Blue Bell, Pa.

[21] Appl. No.: 80,545

[22] Filed: Jun. 24, 1993

[51] Int. Cl.$^6$ .................... H03K 17/14; H03K 17/16
[52] U.S. Cl. .................... 327/384; 327/58; 327/74; 327/362; 327/65
[58] Field of Search ............... 307/542.1, 360, 361, 307/350, 351, 490, 494, 491, 359

[56] References Cited

U.S. PATENT DOCUMENTS

| | | | |
|---|---|---|---|
| 4,007,382 | 2/1977 | Warberg | 307/236 |
| 4,121,121 | 10/1978 | Gabeler | 307/351 |
| 4,241,455 | 12/1980 | Eibner | 307/351 |
| 4,257,125 | 3/1981 | Theall, Jr. | 455/608 |
| 4,618,770 | 10/1986 | Maile | 307/360 |
| 4,833,346 | 5/1989 | Marple | 307/359 |

FOREIGN PATENT DOCUMENTS 4132413  5/1992  Japan ............... 307/542.1

OTHER PUBLICATIONS

Lenk, John D., *Manual for MOS Users*, Reston Publishing Company Inc., a Prentice-Hall Company, Reston, Va., 1975, pp. 112–113.

*Primary Examiner*—John S. Heyman
*Assistant Examiner*—My-Trang Nu Ton
*Attorney, Agent, or Firm*—Glenn W. Bowen; Mark T. Starr

[57] ABSTRACT

A signal processing circuit that is subject to signal chatter is provided with signal chatter-elimination circuitry. Prior signal processing circuitry included a peak voltage detector which received a data input signal and provided a peak voltage representation of the input signal and a threshold-comparator that provided a threshold-comparison signal of a first output voltage magnitude when the peak voltage representation was below a predefined threshold voltage and of a second output voltage magnitude when the peak voltage representation was above the predefined threshold voltage. Improved signal chatter elimination is achieved by the further incorporation of a differential operational amplifier that has (a) a first input terminal that receives a data-representative signal which is subject to signal chatter, (b) a second input terminal that is coupled to receive a threshold-comparison signal of either a first fixed voltage level that blocks the output signal, or of a second variable voltage level that allows the output signal to be provided by the amplifier, and (c) a source of second variable voltage level which is temperature compensated, and the further incorporation of a threshold-level switch coupled to the threshold-comparator to receive the threshold comparison signal and to the amplifier, wherein the threshold-level switch is constructed to supply the first fixed voltage level to the second input terminal when the input signal is below the threshold voltage and the second voltage level to the second input terminal when the input signal is above the threshold voltage.

2 Claims, 1 Drawing Sheet

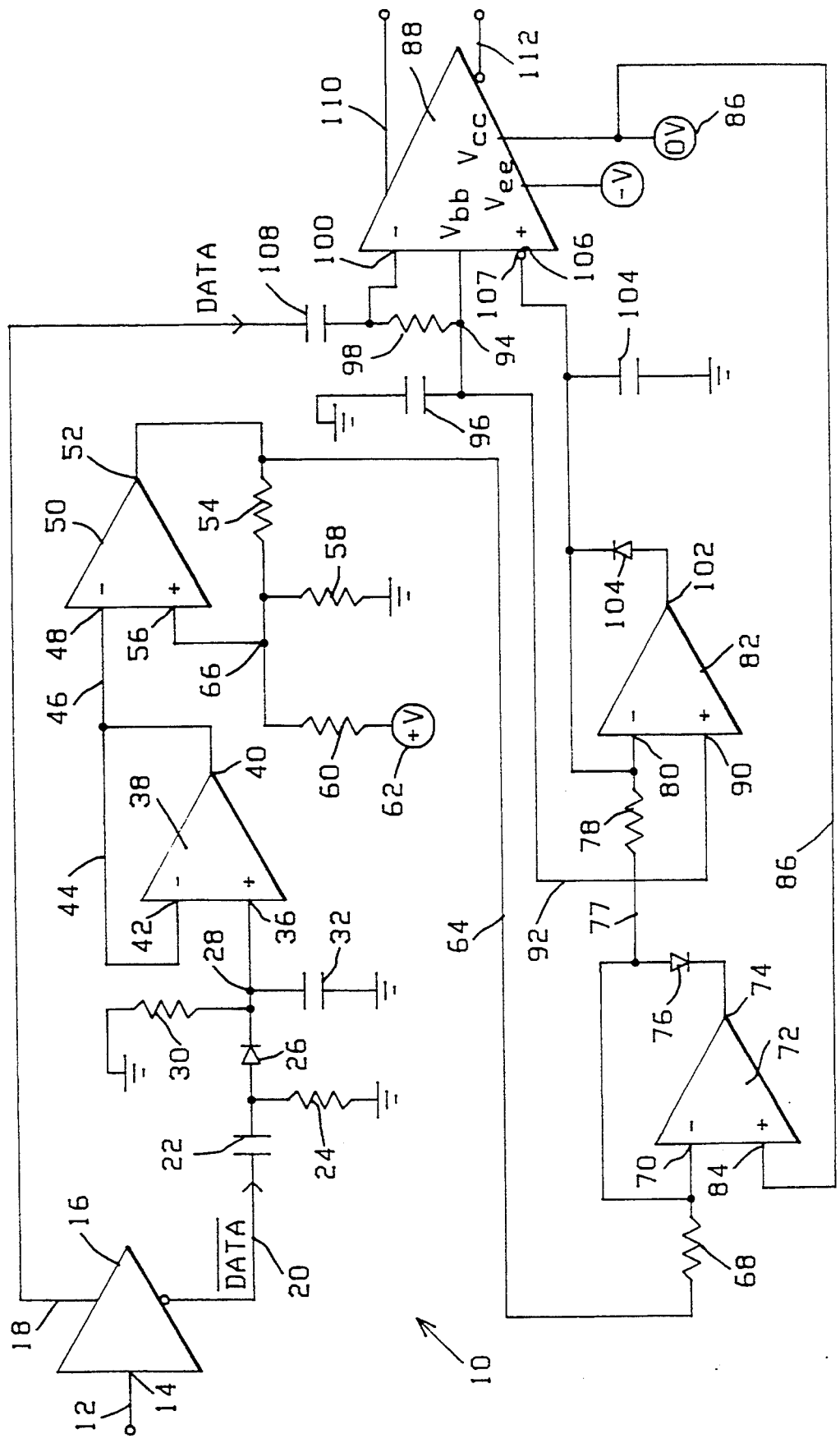

CIRCUIT TO ELIMINATE SIGNAL CHATTER IN THE OUTPUT OF A FIBER-OPTIC RECEIVER

BACKGROUND OF THE INVENTION

Field of the Invention

This invention relates generally to signal processing receivers and, in particular, to a circuit for eliminating signal chatter in the output of a fiber optic receiver.

DESCRIPTION OF THE BACKGROUND AND PRIOR ART

Signal chatter is a common problem in the output of receivers which are utilized to process an electrical signal after it has been converted from a light signal. Such chatter can be eliminated through switching circuits that employ at least one latch which is activated by a sensor that will sense when excessive noise is present, but this approach results in high power dissipation. U.S. Pat. No. 4,257,125 entitled "Receiver for Unipolar Manchester Fiber Optics Signals," issued Mar. 17, 1981 in the name of Charles E. Theall, Jr. shows a receiver that includes direct current offset correction circuitry to prevent drift of the signal baseline, and threshold circuitry which is controlled to assure half-peak amplitude, or mid-amplitude, processing of electrical signals.

U.S. Pat. No. 4,833,346 entitled "Switched Threshold Comparator for a Fiber-Optic Receiver," issued May 23, 1989 in the name of Wendell P. Marple, shows a differential comparator which has an effective threshold which is switched between two predetermined values in response to the output of a differential comparator to provide a switched threshold comparator. The fiber optic receiver uses the polarity of an edge detector to switch the threshold in preparation for the receipt of the next state change.

U.S. Pat. No. 4,007,382 entitled "Bipolar Signal Processing Circuit," issued Feb. 8, 1977 in the name of John Martin Warberg, describes the recovery of degraded pulses in coded communications using bipolar circuit devices. A level indication signal from the input signal is supplied through an inverter to the inverting input of one comparator and directly to the inverting input of a second comparator. The non-inverting inputs of these comparators are supplied with reference voltage from a reference voltage generator which is coupled to a hysteresis generator. The outputs of both of the comparators are Supplied to the hysteresis generator through a logic gate. The circuit is used to recover degraded pulses that are used in bipolar coded communications. The reference Voltage is derived in the input signal, and the hysteresis generator applies the output of the reference voltage generator to the non-inverting input of both of the comparators so they may be switched from a low reference voltage level to a high reference voltage level whenever an output signal is present for either of the comparators.

Differential amplifiers are commonly employed in signal processing circuits. Such amplifiers employ temperature compensation to maintain optimum operation. Various types of temperature compensation techniques are known which can provide nodes at which a temperature-compensated voltage or current is presented. The book "Manual for MOS Users," by John D. Lenk, Reston Publishing Company, Inc., a Prentice-Hall Company, Reston, Va., Copyright 1975, describes some of such techniques on pages 112 and 113.

SUMMARY OF THE INVENTION

Signal chatter for a data input signal is eliminated in a receiver circuit by comparing the peak voltage of a detected input signal to a threshold level, applying a data-representative signal to an input of a differential amplifier, applying a fixed voltage level to another input of a differential amplifier when the detected peak voltage is below the threshold level, which thereby blocks said differential amplifier from supplying an output signal, and alternately applying a variable voltage level derived from a temperature-compensation voltage in the differential amplifier to another terminal when the detected peak voltage is above the threshold level, which thereby allows the differential amp to provide an output signal that is a function of the data-representative signal.

BRIEF DESCRIPTION OF THE DRAWINGS

The FIGURE is a schematic drawing of the embodiment of the invention.

DESCRIPTION OF THE PREFERRED EMBODIMENT

The circuit of this invention is preferably used for fiber optic data communication receivers in which outputs can randomly toggle between logic level states when the input optical signal becomes too weak. This can occur because even under weak signal conditions, the high-gain fiber optic analog channel presents enough signal plus noise to the receiver output buffer, which has differential logic outputs, to toggle it in a random fashion resulting in high system error rates. The present invention disables the buffer without a latch, and therefore accomplishes its purpose with very little dissipation of power. This is achieved by using only one input of a differential input of the receiver output buffer for the signal, and by clamping the other differential input to one of two preset levels which are selected by the circuitry according to the measured input signal power. In the present invention, the two preset levels are preferably generated at the Vcc and Vbb voltage levels of the output buffer, and clamping is obtained through employment of low dissipation operational amplifiers.

The FIGURE illustrates a schematic diagram of an embodiment of the chatter elimination circuit 10 of the present invention. The input data signal which has been converted from a light signal to an electrical signal is supplied on the input line 12 to the input terminal 14 of the analog amplifier 16. The amplifier 16 produces a data output signal on the line 18, which is a non-inverted amplified version of the input pulses on the line 12, and an inverted data signal on the line 20, which is polarity-inverted with respect to pulses on the line 18. By dividing the signal into data and data, data signals can be sent directly to the output amplifier, but the invention could be implemented with only the data or data signals, as is readily apparent to those of ordinary skill in the art. Data pulses on the line 20 are coupled through the coupling capacitor 22 to the resistor 24 which develops a voltage that is supplied to the anode of the diode 26. The cathode of the diode 26 is coupled to the junction point 28 of the resistor 30 and the capacitor 32. The other terminal end of the resistor 30 provides a DC return for the diode while the other terminal of the capacitor 32 is coupled to ground.

The rectified voltage developed across the capacitor 32 corresponds to the peak voltage of the input signal. This peak voltage signal at the junction point 28 is coupled to the non-inverting terminal 36 of the operational amplifier 38, which by virtue of having its output 40 and its inverting input 42 coupled together through the line 44 operates as a voltage follower. Thus, the voltage developed at the output 40 of the operational amplifier 38 is supplied on the line 46 to the inverting input terminal 48 of the operational amplifier 50, which is arranged as a Schmitt trigger with hysteresis. The output 52 of the Schmitt trigger 50 is coupled through the resistor 54 back to its non-inverting input 56. The resistor 54 is also connected at the junction point 66 to the resistor 58, which is coupled at its other end to ground, and to the resistor 60 which is coupled to the positive voltage supply at the terminal 62. The output 52 is also coupled on the line 64. The values of the resistors 58 and 60 set the voltage at the junction point 66 which determines the threshold point for the incoming peak voltage Signal on the line 46.

Thus, when the peak amplitude of the $\overline{\text{data}}$ signal on the line 20 is greater than threshold determined by the Schmitt trigger 50 and its components, the output 52 of the amplifier 50 will be at a negative voltage level, and when the $\overline{\text{data}}$ signal is less than the threshold limit, this output will be at a positive voltage level. The output 52 is coupled on the line 64 to the input resistor 68 that is also coupled to the inverting input terminal 70 of the differential operational amplifier 72. The output 74 of the amplifier 72 is coupled to the cathode of a diode 76 the anode of which is coupled back to the inverting input 70. The cathode of the diode 76 is also coupled to the input resistor 78 which in turn is coupled to the non-inverting input terminal 80 of the operational amplifier 82. The non-inverting input 84 of the differential amplifier 72 is coupled on the line 86 to the Vcc voltage of the receiver output buffer at the terminal 86 of the output buffer amplifier 88. In the described embodiment, the positive Vcc voltage is preferably substantially at ground or zero volts, and the Vee voltage is negative, as is common practice for emitter-coupled logic (ECL) buffers. For pECL buffers, Vcc would be at a positive voltage level and Vee at ground or some other negative voltage level with respect to Vcc. Such modifications and others of a similar nature will be readily apparent to those skilled in the art from the described embodiment.

The non-inverting input 90 of the differential amplifier 82 is coupled on the line 92 to the junction point 94 of the capacitor 96 and the input resistor 98 to supply AC ground for the junction point 94. The resistor 98 is coupled between the inverting input terminal 100 of the output amplifier 88 and a terminal 107 which allows access to the Vbb voltage of the buffer 88 at the junction point 94. The Vbb voltage is an internal reference voltage which is commonly implemented in differential buffer amplifier circuits. An example of a differential line receiver which has such a Vbb voltage is the F100114 quint differential line receiver which is implemented in emitter-coupled-logic (ECL) technology and is commercially sold by National Semiconductor. The invention, however, as will be readily apparent to those of ordinary skill in the art, may be implemented with various other types of semiconductor technology.

The output 102 of the differential amplifier 82 is coupled to the anode of the diode 104, the cathode of which is coupled back to the inverting input 80 of the amplifier 82. The cathode is also coupled to the capacitor 104 which has one end connected to the non-inverting input terminal 106 of the output amplifier 88 and its other end connected to ground to supply AC ground for the terminal 106. The data signal which was provided on the line 18 is coupled through the coupling capacitor 108 to the inverting input 100 of the amplifier 88. The amplifier 88 provides an output data signal on the line 110 and a $\overline{\text{data}}$ signal on the output 112. The output signals on the lines 110 and 112 are, therefore, dependent on the differential input of the signals on the non-inverting terminal 106 and the inverting terminal 100.

A switchable reference voltage is supplied at the non-inverting terminal 106, such that either substantially the Vcc voltage will be present at the non-inverting input 106 when the input signal is less than the established threshold level, and the Vbb voltage will be supplied when the input signal is greater than the threshold level. When the Vcc voltage is supplied to the non-inverting input 106 of the receiver output buffer 88, the passage of noisy data signals through the receiver is blocked, but when the input signal is greater than the threshold level, the voltage at the input 106 becomes Vbb which allows data to pass through the receiver output buffer.

The two operational voltage levels at the input 106 are achieved in the following manner. When the output of amplifier 50 on the line 64 is at a positive voltage level, the output terminal 74 of the operational amplifier 72 will be slightly negative, and thus the voltage on the anode of the diode 76 will be at approximately zero volts due to the forward voltage drop of the diode 76. Therefore, amplifier 72 acts as a signal follower for a positive input. Thus, the voltage applied to the non-inverting input terminal 106 of the output buffer 88 through the resistor 78 will be substantially the same as the non-inverting input 84 of amplifier 72 which is approximately Vcc. The noisy data signals on the input 100 are then not allowed to pass through the receiver output buffet to the output lines 110 and 112 and cause chatter for the circuits that follow the output buffer 88.

However, if data does not exceed the threshold provided by the amplifier 50 and its associated circuitry, the output 52 will be at a negative voltage level, and this will cause reverse bias of the diode 76, and the output terminal 74 of the operational amplifier 72 will be at approximately the negative voltage of line 64. The negative voltage 77 then provides current flow through the resistor 78 which drives the operational amplifier 82 so that the voltage on its output 108 forward biases the diode 104, and the Vbb voltage on the line 92 is coupled to the non-inverting input 106 of the buffer amplifier 88, and data signals on the input line 100 are allowed to pass through the receiver output buffer 88 to the output lines 110 and 112 and are thus valid data for the circuits that follow the output buffer 88. Since the Vbb level in the present invention is acquired from a temperature compensation voltage level point in the receiver output buffer, it provides automatic temperature compensation for the circuit of the described embodiment thereby keeping the output logic levels within specifications.

I claim:

1. A signal chatter elimination circuit for the elimination of signal chatter in a data signal comprising:

a peak voltage detector that receives said data signals and is constructed to provide a peak voltage signal that is representative of the peak voltage of said data signal, a threshold comparator that is coupled to said peak voltage detector for receiving said peak voltage signal that is constructed to provide a control signal that is at a first voltage level when said peak voltage signal has a magnitude that is below a defined threshold voltage magnitude and is at a second voltage level when said peak voltage is above said defined threshold voltage magnitude, a differential amplifier which is capable of supplying an output signal representative of said data signal which comprises:
  (a) a first input terminal coupled to receive said data signal which causes an output of said differential amplifier to be driven in a first polarity direction in response to said data signal,
  (b) a second input terminal coupled to receive an applied signal that causes said output to be driven in a second polarity direction in response to said applied signal, and
  (c) a variable voltage level source which provides a temperature compensation signal, and a threshold-level switcher coupled to said threshold-comparator to receive a threshold comparison signal and to said differential amplifier, which is constructed to supply said control signal to said second input terminal, wherein temperature compensation signal is also coupled to said second input terminal so that said applied signal comprises said control signal and said temperature compensation signal and said second voltage level is of a magnitude such that said output signal of said differential amplifier is supplied at a fixed voltage level when said control signal is at said second voltage level.

2. A signal chatter elimination circuit as claimed in claim 1 wherein said threshold-level switcher comprises first and second operational amplifier voltage followers coupled in cascade, wherein each voltage follower comprises a signal input terminal, a reference input terminal and an output terminal, and said signal input terminal of said first voltage follower is coupled to said threshold comparator to receive said control signal, said output terminal of said first voltage follower is coupled to said signal input terminal of said second voltage follower, said output terminal of said second voltage follower is coupled to said second input terminal of said differential amplifier, said reference input terminal of said first voltage follower is coupled to a reference voltage and said reference terminal of said second voltage follower is coupled to said source of said temperature compensation signal.

* * * * *